United States Patent [19]

Fujiki et al.

[11] Patent Number: 5,012,182
[45] Date of Patent: Apr. 30, 1991

[54] ELECTRICAL MEASURING DEVICE

[75] Inventors: Toshisada Fujiki, Kasugai; Taikichi Kondo, Gifu; Yoshinari Furukawa, Tokoname; Kazuaki Kato, Chita; Akimichi Okimoto; Kenji Tsuge, both of Nagoya, all of Japan

[73] Assignee: NGK Insulators, Ltd., Nagoya, Japan

[21] Appl. No.: 423,781

[22] Filed: Oct. 18, 1989

Related U.S. Application Data

[62] Division of Ser. No. 34,150, Apr. 1, 1987, Pat. No. 4,894,609.

[30] Foreign Application Priority Data

| Aug. 7, 1985 | [JP] | Japan | 60-174554 |
| Aug. 7, 1985 | [JP] | Japan | 60-174555 |
| Aug. 7, 1985 | [JP] | Japan | 60-174556 |

[51] Int. Cl.$^5$ .................. G01R 1/20; G01R 19/00; H01B 17/00
[52] U.S. Cl. ...................... 324/96; 174/139; 324/107; 324/127
[58] Field of Search .................. 324/96, 107, 157, 127; 174/139, 150; 350/96.20, 96.23

[56] References Cited

U.S. PATENT DOCUMENTS

| 3,312,895 | 4/1967 | Garbuny | 324/96 |
| 3,312,898 | 4/1967 | Browne | 324/117 H |
| 3,324,393 | 6/1967 | Casey et al. | 324/96 |
| 3,485,940 | 12/1969 | Perry et al. | 174/139 |
| 3,506,833 | 4/1970 | Willisen | 324/96 |
| 3,662,263 | 5/1972 | Bensel | 324/96 |
| 3,679,974 | 7/1972 | Mollenbeck | 324/96 |
| 4,269,483 | 5/1981 | Feldtkeller | 324/96 |
| 4,810,836 | 3/1989 | Shinoda et al. | 174/139 |
| 4,921,322 | 5/1990 | Seike et al. | 174/139 |

FOREIGN PATENT DOCUMENTS

| 19-6791 | 3/1944 | Japan . |
| 19-7588 | 3/1944 | Japan . |
| 55-96507 | 7/1980 | Japan . |
| 58-109858 | 6/1983 | Japan . |
| 58-172557 | 10/1983 | Japan . |
| 60-158402 | 8/1985 | Japan . |

Primary Examiner—Ernest F. Karlsen
Attorney, Agent, or Firm—Parkhurst, Wendel & Rossi

[57] ABSTRACT

The disclosed porcelain insulator has built-in optical transmission media extending therethrough from a base metal secured at one end thereof to a conductor-holding fixture at the opposite end thereof. The conductor-holding fixture may carry one or both of two type sensing units: namely, a sensing unit having a current transformer (CT) coupled to the phase conductor, a load resistor connected to the CT, and an electro-optic element coupled to both said load resistor and said optical transmission medium; and another sensing unit having a capacitive potential transformer (PT) coupled to said conductor and an electro-optic element coupled to both said PT and said optical transmission medium. An electric measuring device is formed by applying light to the electro-optic element through the optical transmission medium of the insulator, modulating the incident light by the electro-optic element depending on the line current or voltage, receiving the modulated light through the optical transmission medium of the insulator, converting the modulation of the received light into an electric signal. Due to information detection right by the line conductor and optical transmissioin of the information, ill effects such as electromagnetic interference and insulation deterioration at the spot of detection and along the information transmission path are eliminated. Thus, when used in transmission and distribution lines the device improves the safety and accuracy and maintains the improved level of safety and accuracy.

2 Claims, 17 Drawing Sheets

FIG_1
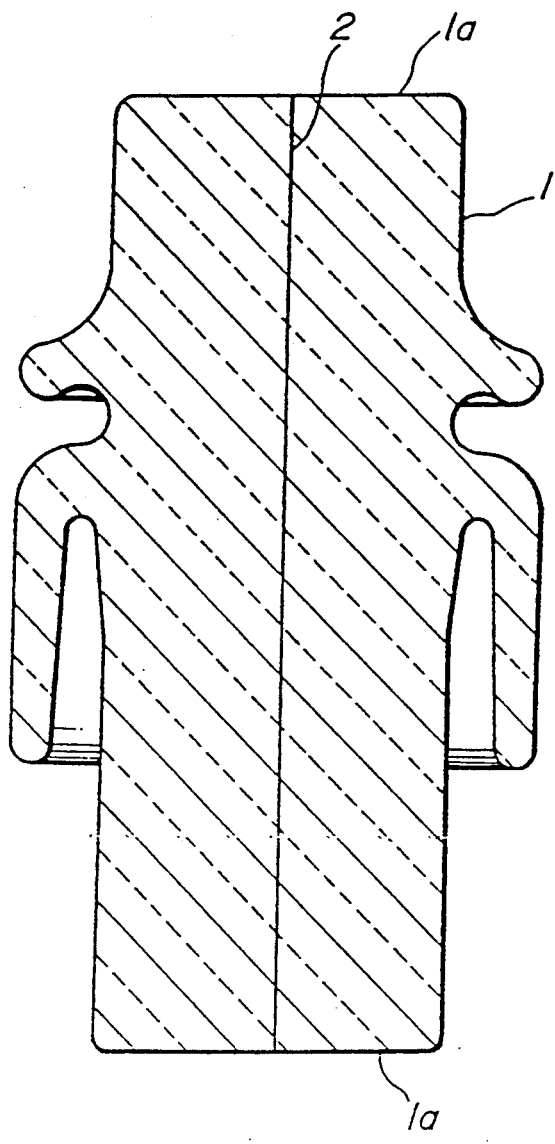

FIG_2
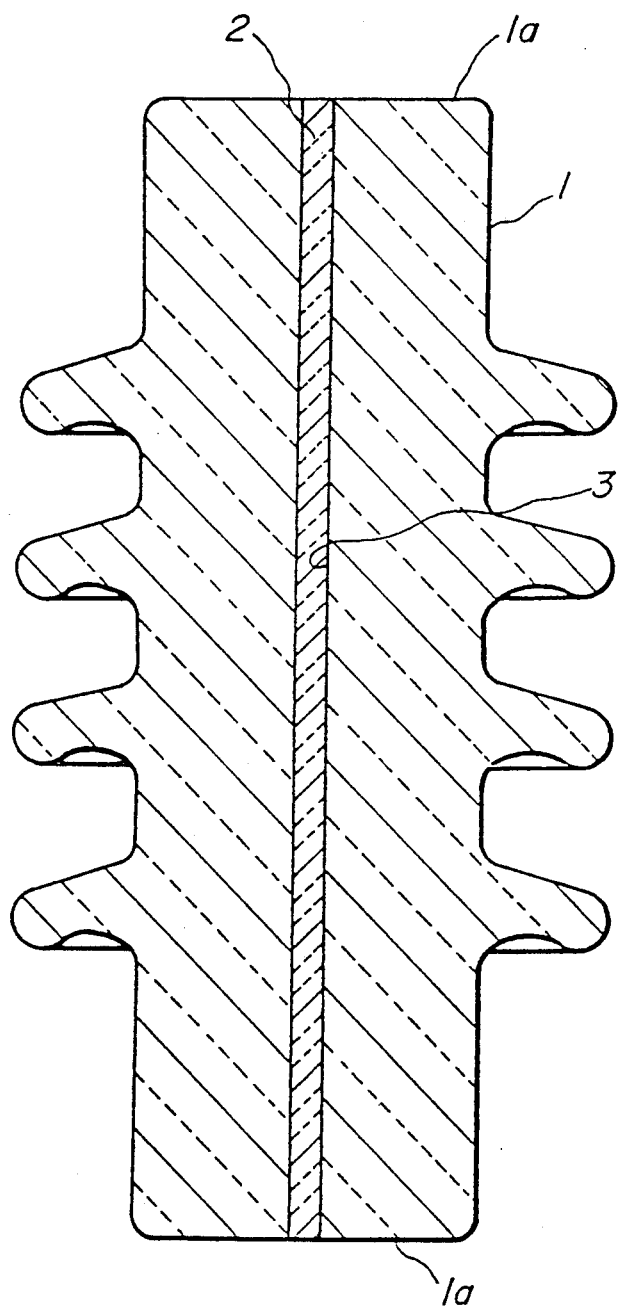

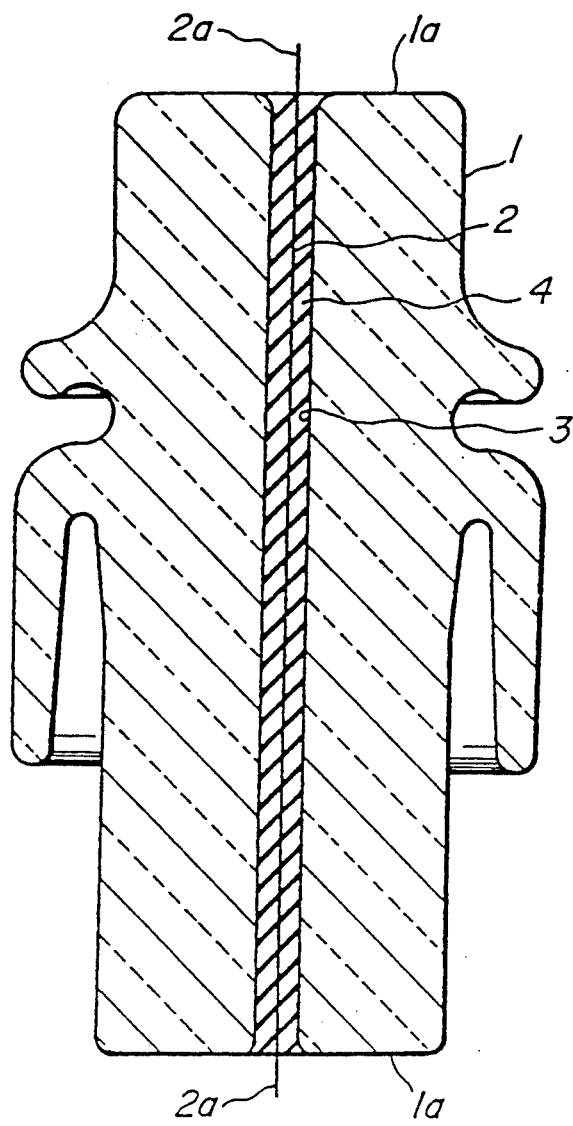
FIG_3

FIG_4
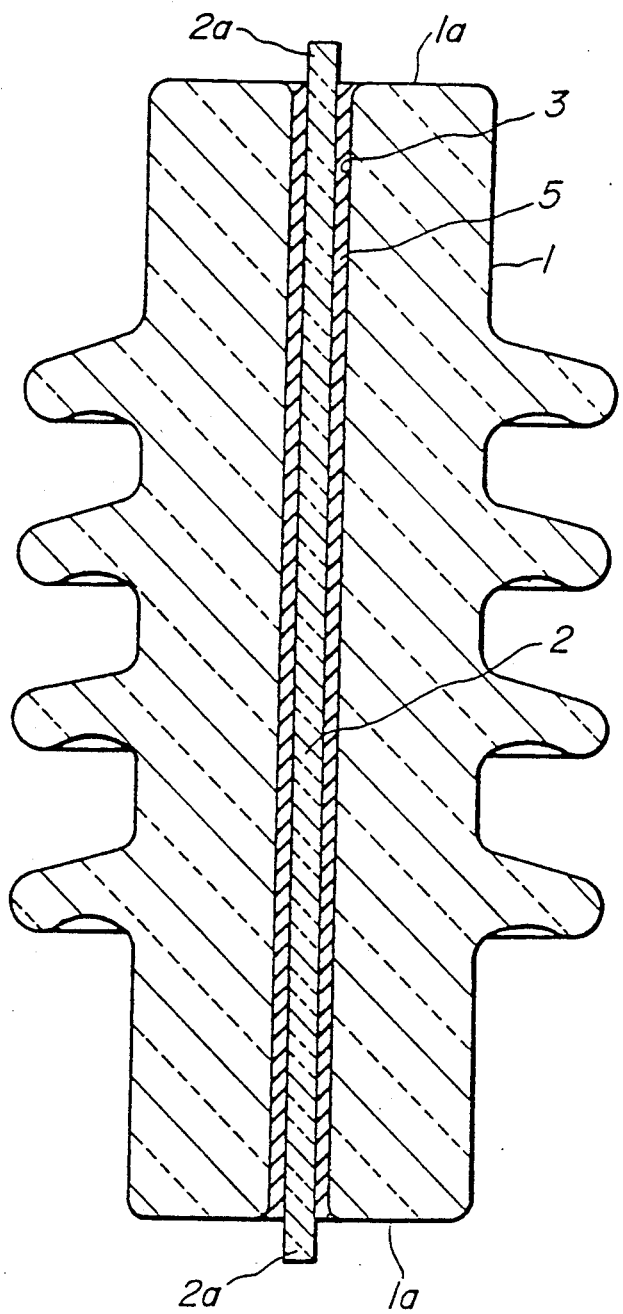

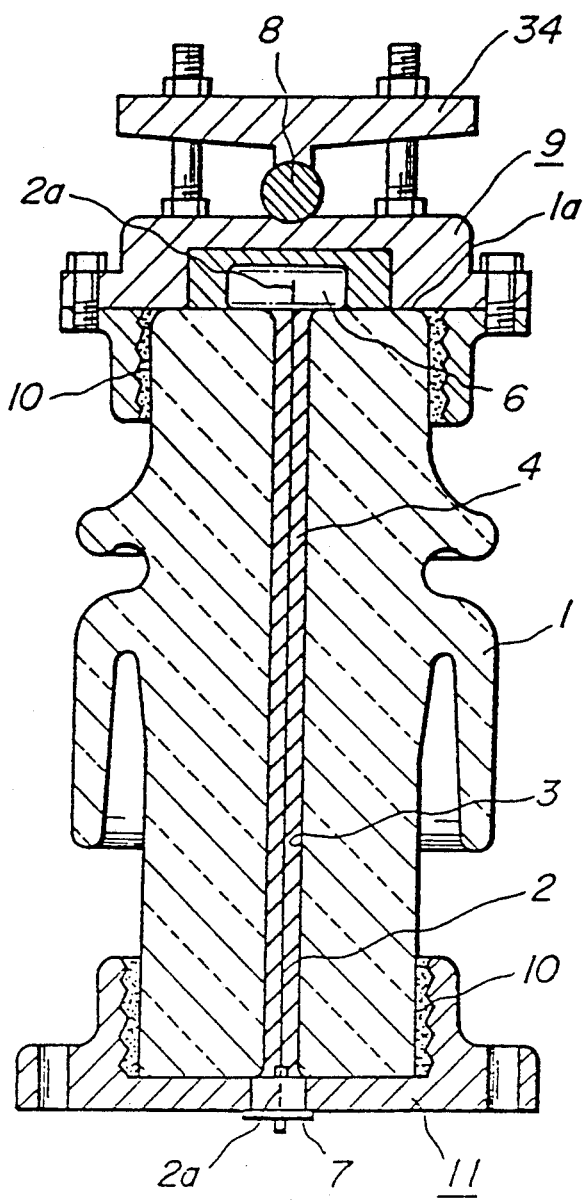
FIG_5

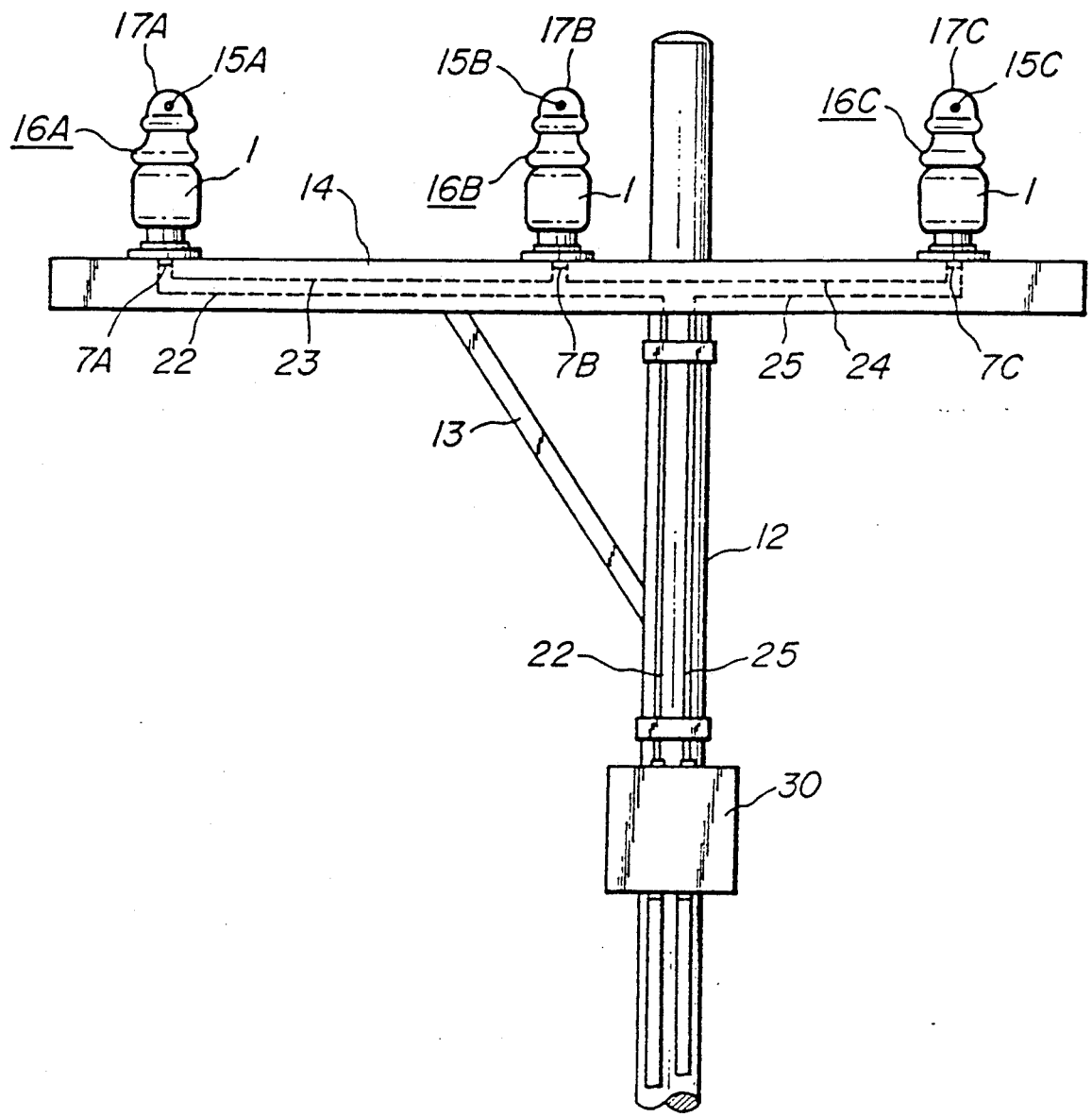
FIG_6

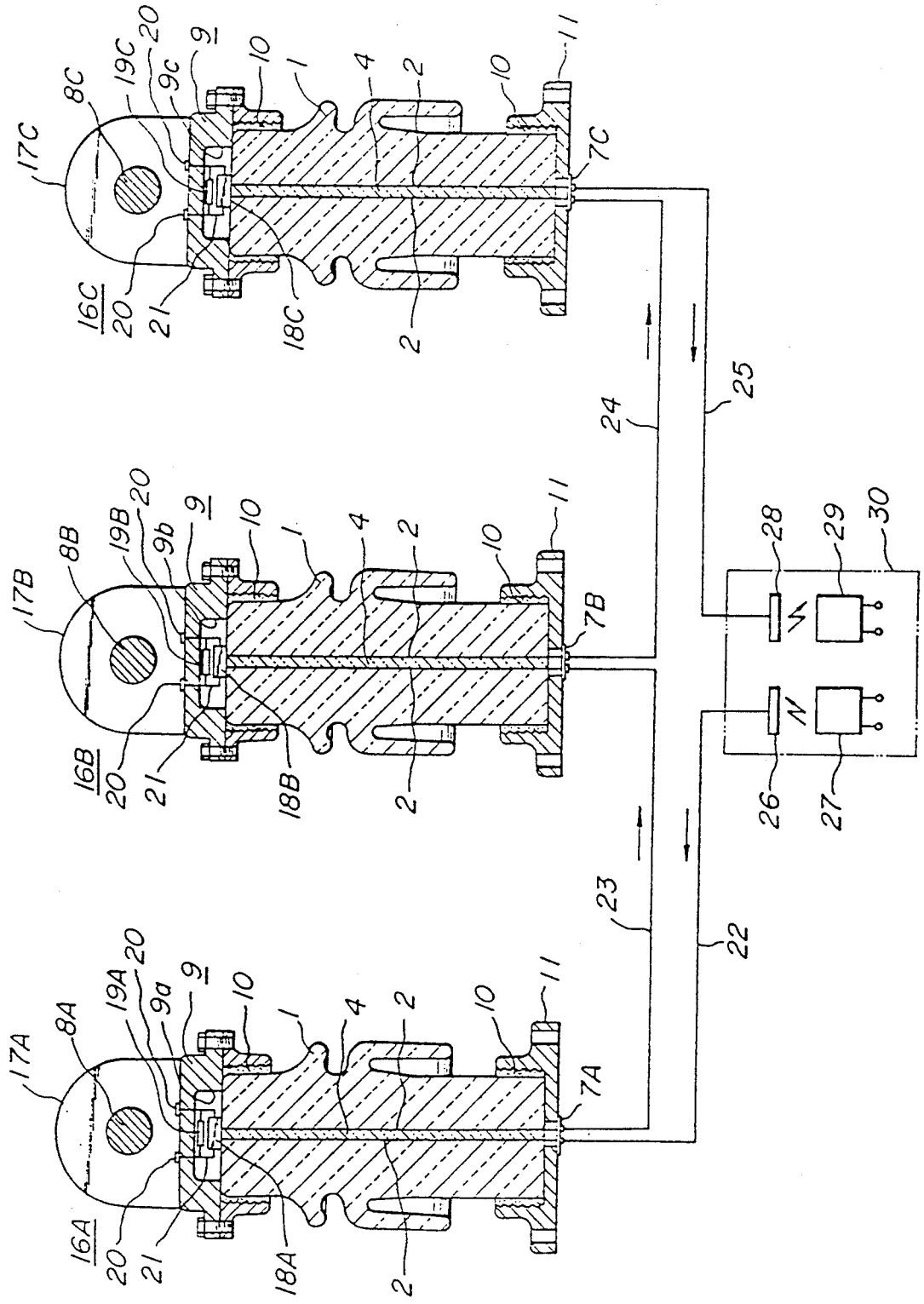
FIG_7

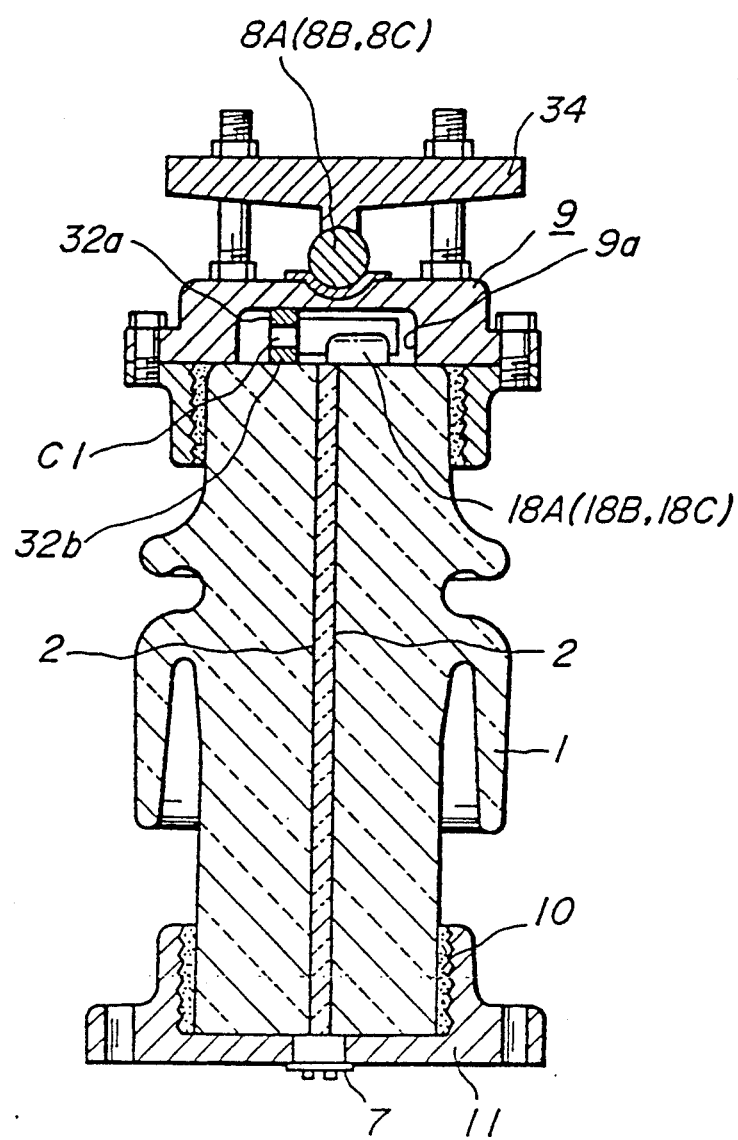
FIG_8

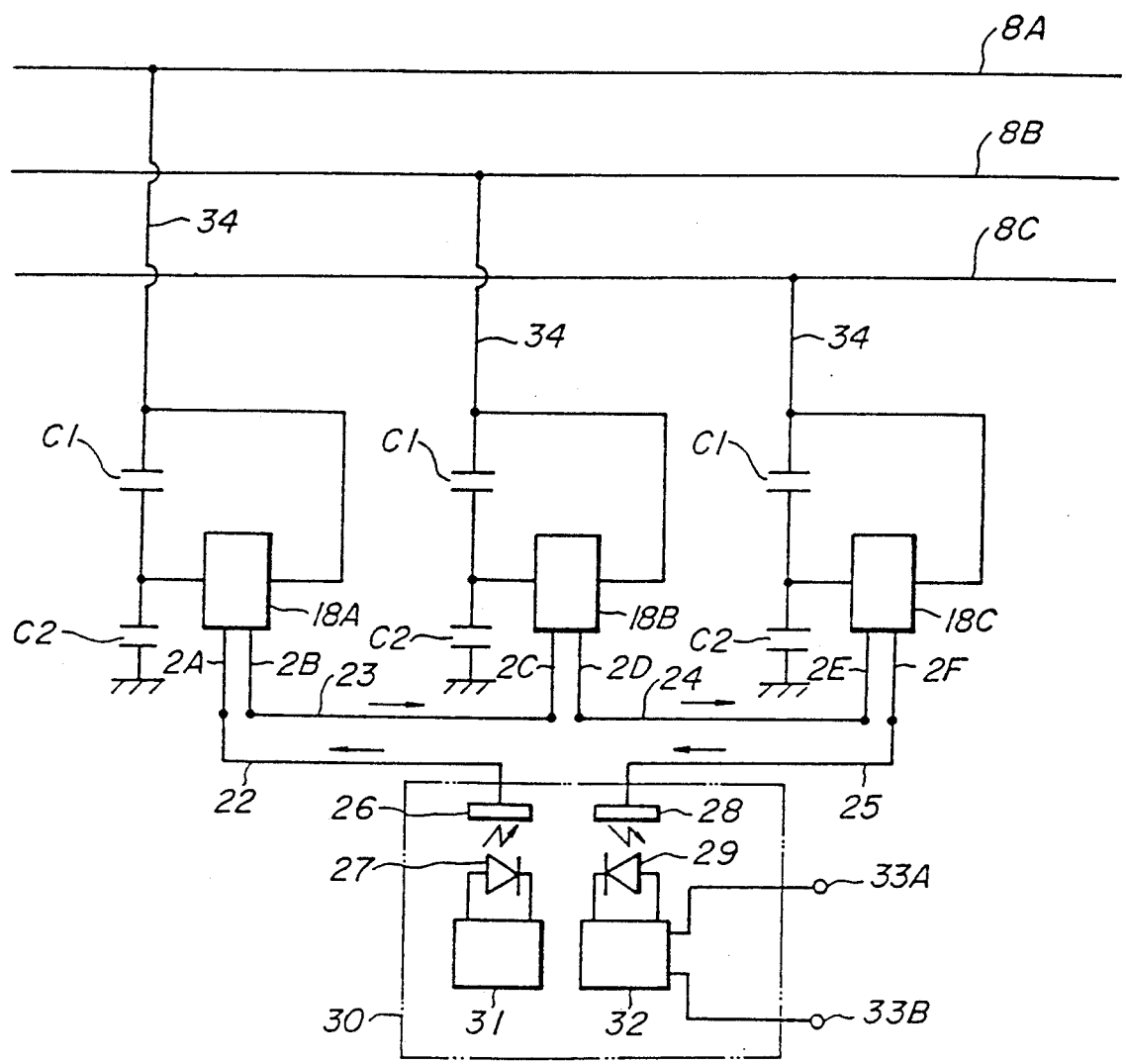
FIG_9

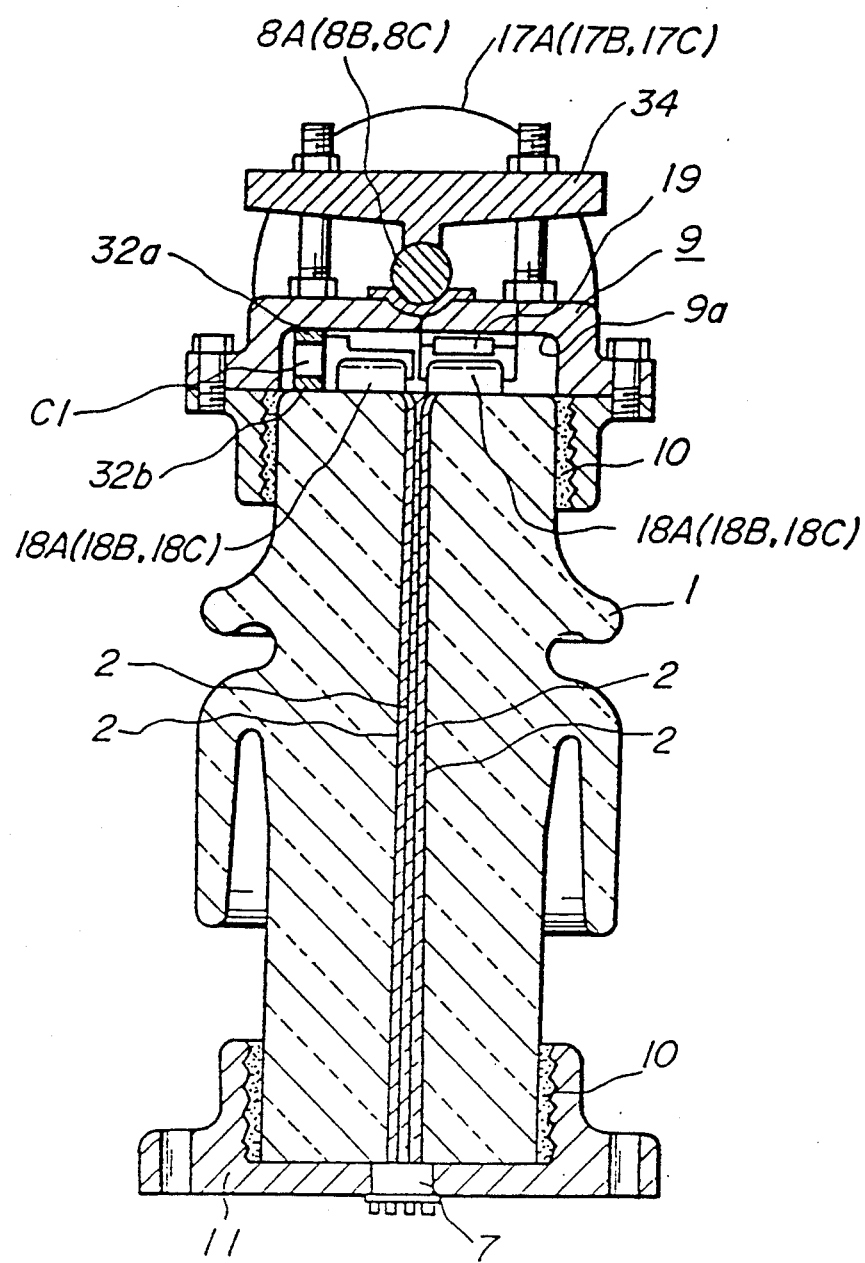
FIG_10

FIG_11
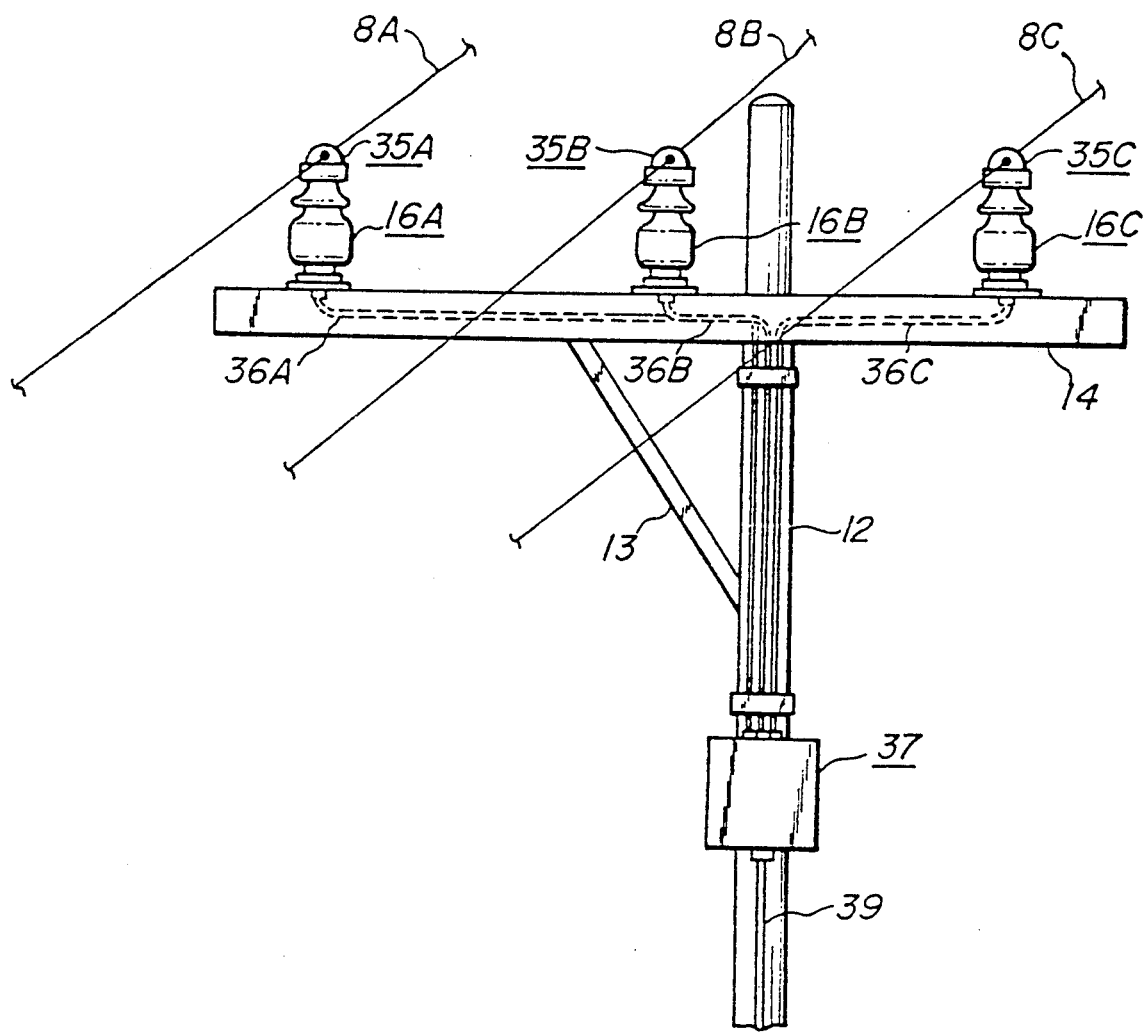

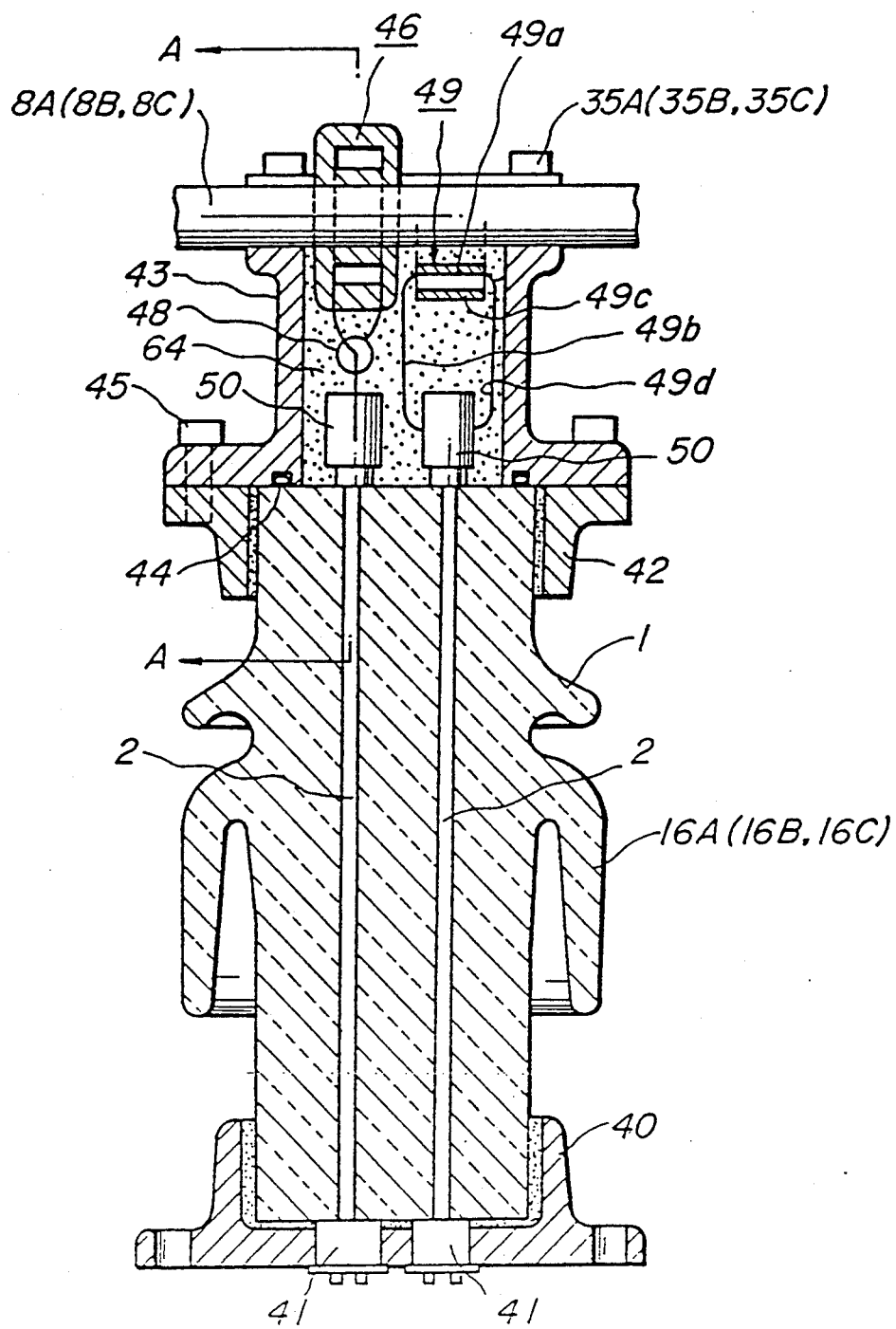
FIG_12

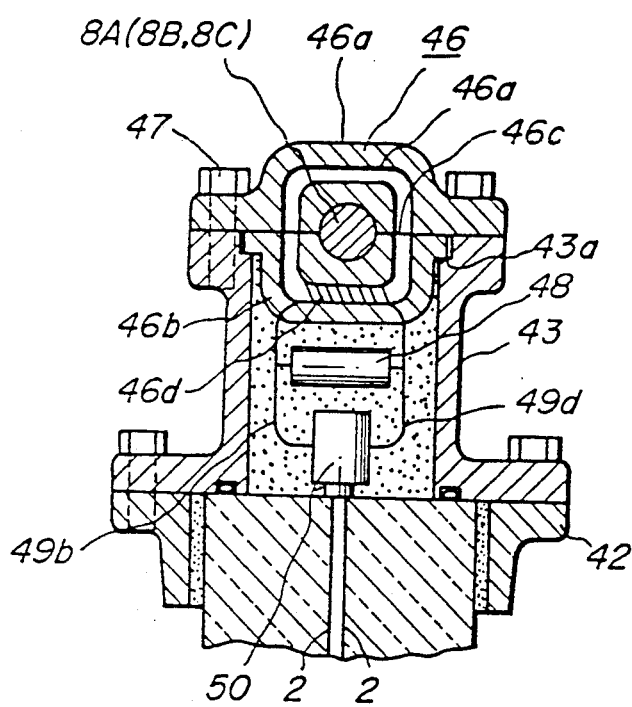
FIG_13
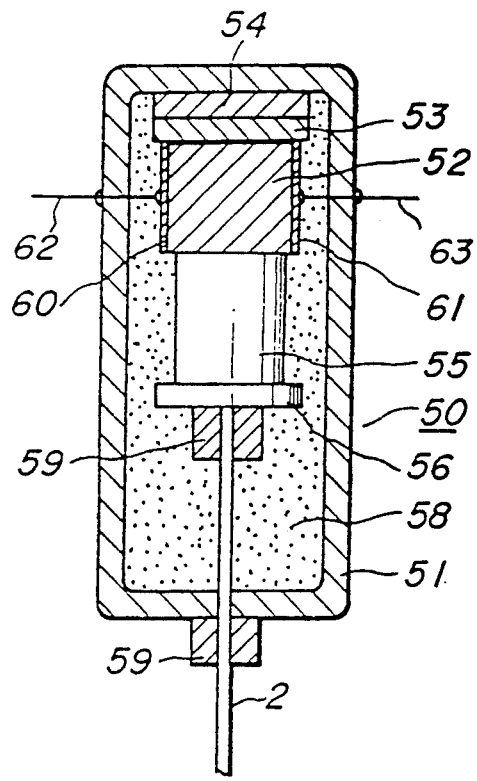
FIG_14

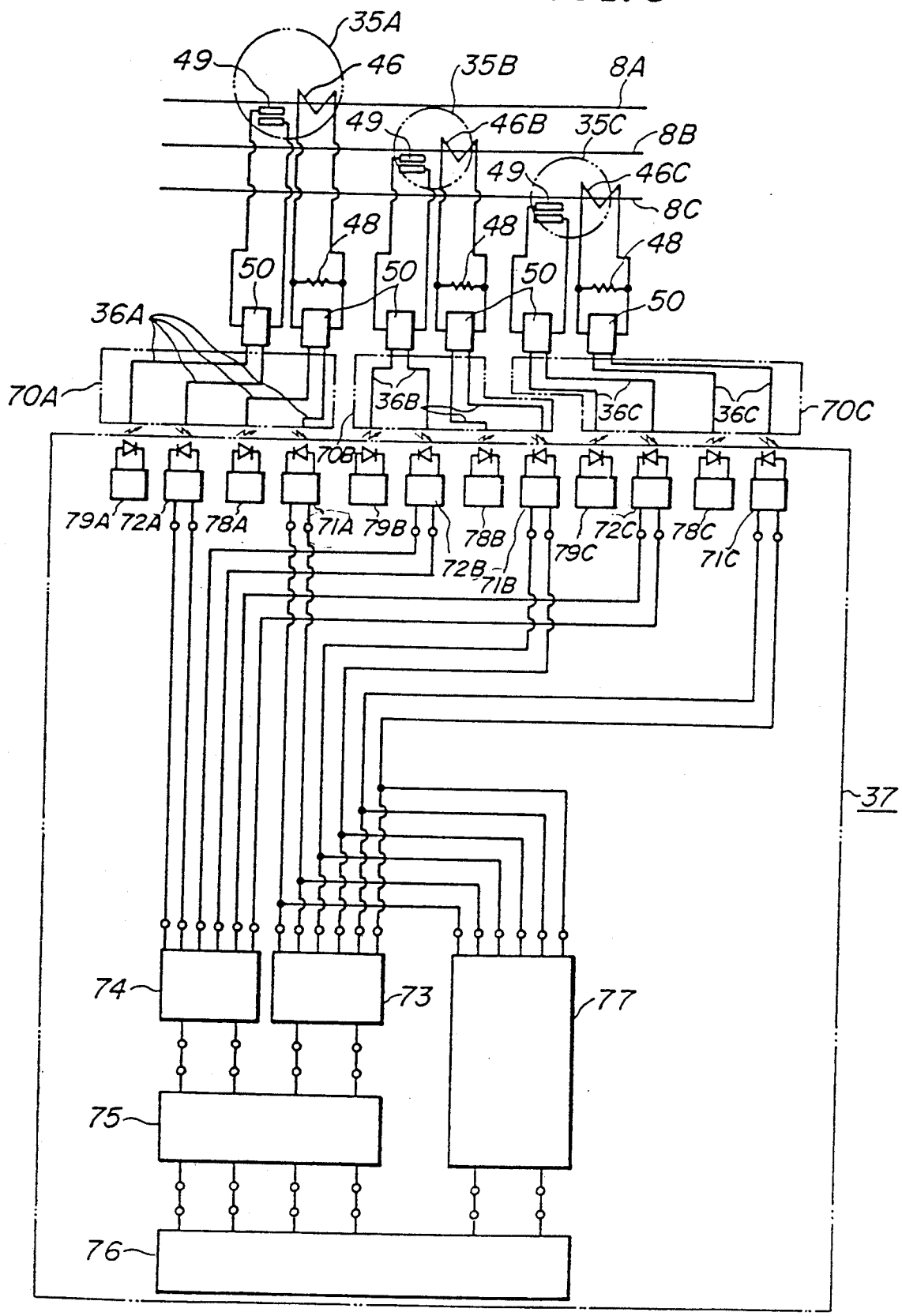
FIG_15

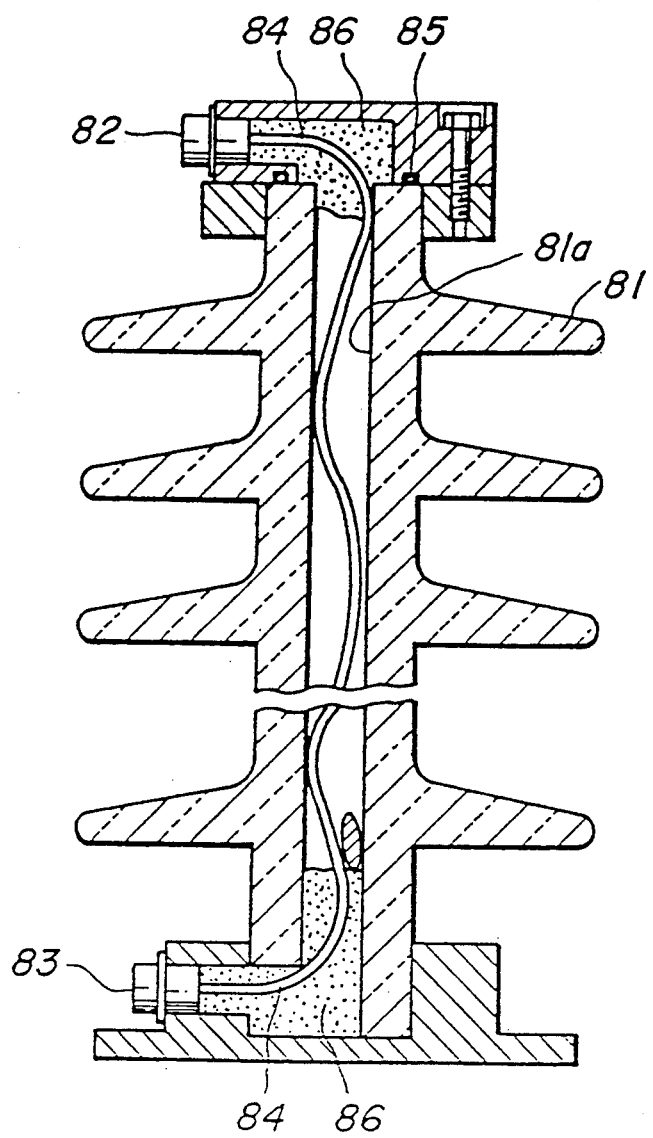
FIG_16

FIG_17
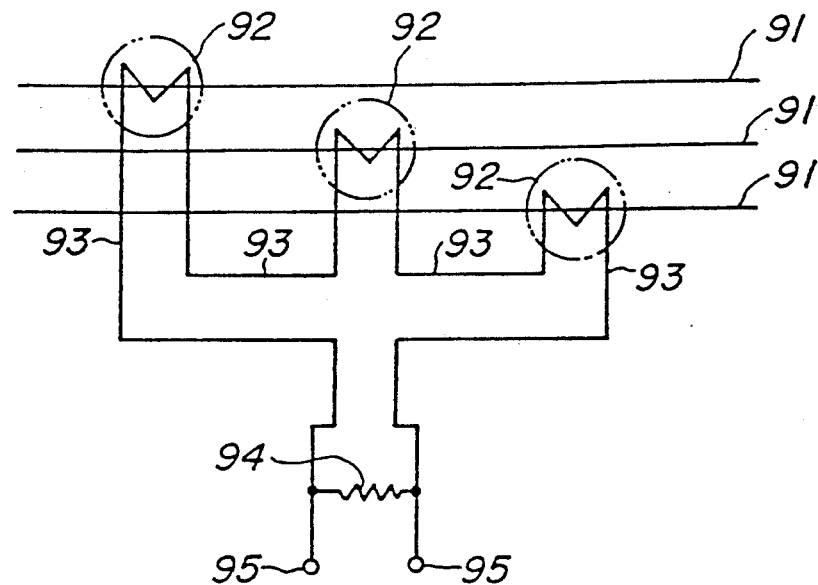
FIG_18
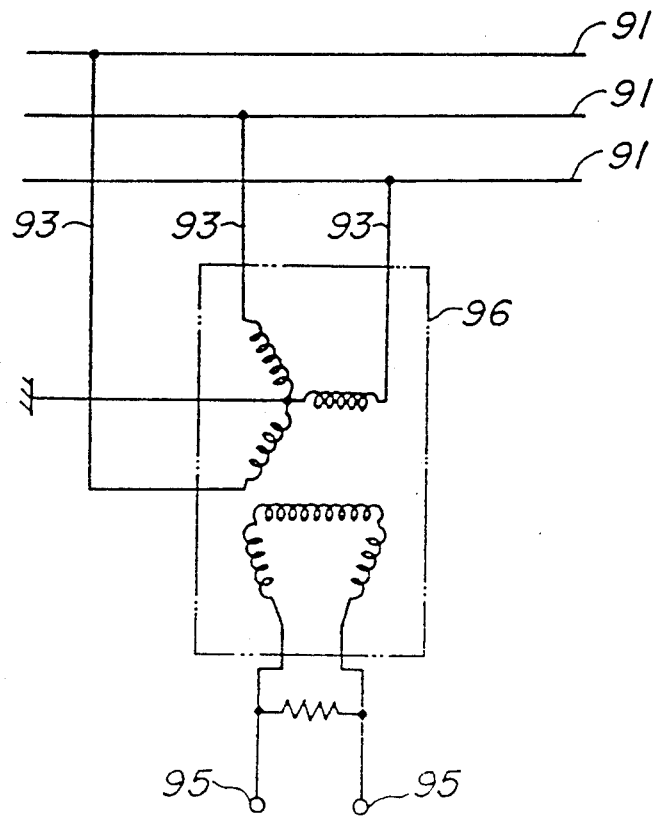

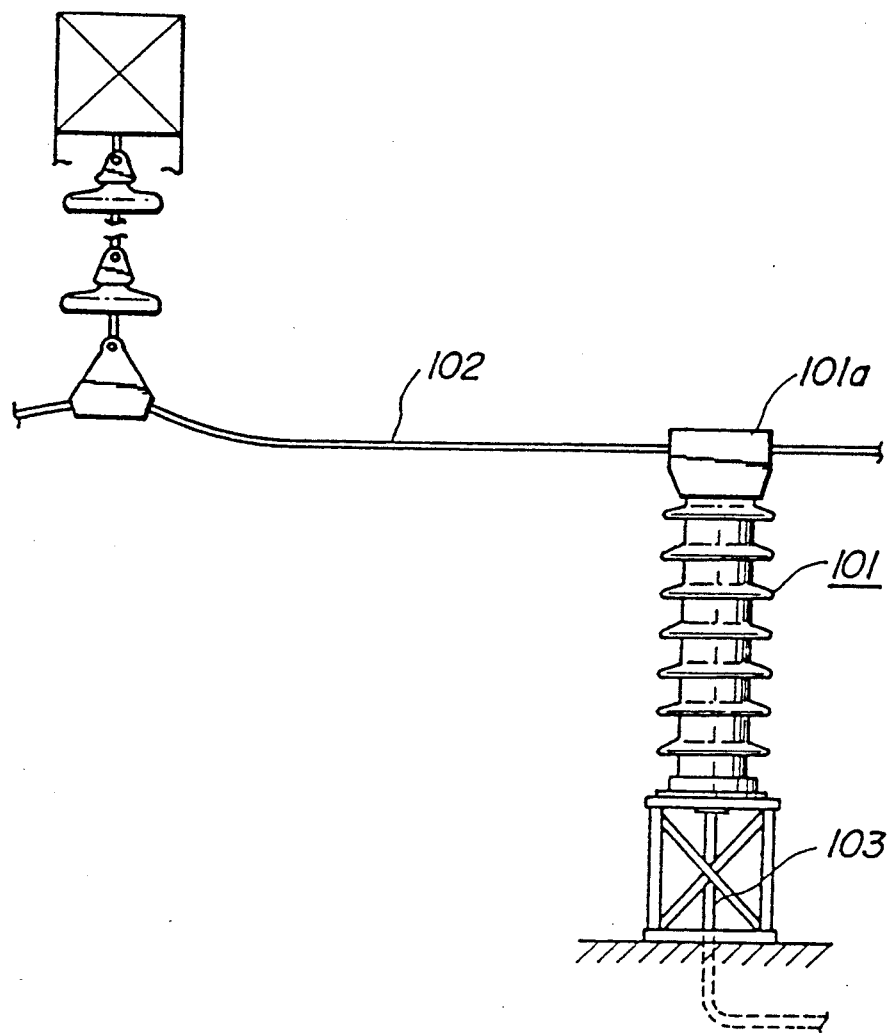
FIG_19

ELECTRICAL MEASURING DEVICE

This is a division of application Ser. No. 034,150, filed Apr. 1, 1987, now U.S. Pat. No. 4,894,609.

TECHNICAL FIELD TO WHICH THE INVENTION RELATES

This invention relates to a porcelain insulator having at least one optical transmission medium embedded therein, which insulator is suitable for supporting a power line conductor while allowing optical connection to an optical sensor for the measurement of the current and voltage of the power line conductor.

This invention also relates to an insulator suitable for the use of converting electric signals on a power line into optical signals to be transmitted to a measuring unit, which insulator can be connected to a light-emitter means and a light-detector means through optical fiber cables.

Further, the invention relates to an electric measuring device with optical sensors for detection and measurement of the zero-phase-sequence current or zero-phase-sequence voltage of a three-phase power line as well as the currents and voltages of individual phases thereof.

BACKGROUND ART

The demand for electric power has been diversified these years, and the need for reliable power supply and quick response to any changes is ever increasing. To meet this need, information on the conditions of power supply, such as line voltages and line currents, must be collected at a high speed through accurate measurement over a wide service area at as many locations as possible. The inventors noted that optical sensors, such as electro-optic elements, are suitable not only for accurate measurement but also for communication of a large amount of data at a high speed through the optical fiber communication systems.

Support insulators of electric apparatus which allow the use of optical are known, for example, Japanese Patent Laid-open Publication No. 143,619/1982 discloses an insulator having communication optical fiber disposed therein.

FIG. 16 shows an example of an insulator with an optical fiber as known in the prior art. An insulator body 81 has a hole 81a extending therethrough, and an optical fiber 84 with optical connectors 82, 83 mounted at opposite ends thereof is disposed in the hole 81a. For protection against moisture and dust particles, the hole 81a is sealed, for instance, by an O-ring 85 and filler 86.

The above-referred insulator has a shortcoming in that the sealed portion, such as the 0 ring 85 and the filler 86, is susceptible to deterioration due to external forces, temperature variations, moisture and aging. It has been difficult to keep the sealed portion intact over a long period of time in a stable manner. Thus, optical sensors connected to the optical fibers 84 in the insulator body 81 have experienced troubles due to insulation deterioration in the hole 81a or deterioration of the optical fiber 84 itself caused by moisture absorption or water infiltration. Further, the operation of inserting the optical fiber 84 in the hole 81 is cumbersome, and it has been a stumbling block for the quality control and mass production of the insulator.

Therefore, an object of the present invention is to provide a porcelain insulator with one or more optical transmission media, e.g., optical fibers, embedded therein, which insulator maintains excellent insulation and optical transmission over a long service life in a stable fashion, while eliminating the abovementioned shortcomings of the prior art under certain external conditions and aging.

FIG. 17 shows a circuit diagram of a conventional device for detecting and measuring the zero-phase-sequence current of a three-phase power line, and FIG. 18 shows a similar circuit diagram of the prior art for detecting and measuring the zero-phase-sequence voltage of the three-phase power line.

For zero phase-sequence current measurement, secondary windings of three current transformers 92 mounted o the three power line conductors 91 are connected in series by lead wires 93 and the serial circuit is closed by a resistor 94 as shown in FIG. 17. Voltage across the output terminals 95, 95 represents the sum of the zero phase-sequence currents in the three phase line conductors 91.

Under normal conditions, the currents in the three-phase power line conductors 91 are balanced, and the zero-phase-sequence current in the three phase power line conductors 91 is zero and the electric signal from the output terminals 95, 95 is also zero. When there is an unbalanced fault in the three-phase power line, the electric signal from the output terminals 95, 95 assumes a finite value depending on the type of the fault.

For the zero-phase-sequence voltage measurement, Y-connected primary windings of a three-phase potential transformer 96 are connected to the three-phase power line conductors 91 by lead wires 93, while the secondary windings of the potential transformer 96 are connected in an open delta which open delta is closed by a resistor 94 as shown in FIG. 18. The three-phase potential transformer 96 may be replaced with a combination of three single-phase potential transformers, provided that the windings are connected similarly.

The output voltage from the output terminals of the potential transformer 96, representing the voltage across the resistor 94, is the zero-phase-sequence voltage of the three-phase power line. The value of the zero-sequence voltage is zero as long as the line voltages of the three-phase power line are balanced, and it assumes a finite value when there is an unbalanced fault in the three-phase power line and the value of the zero-phase-sequence voltage depends on the type of the unbalanced fault.

One or both of the zero-phase-sequence current and the zero-phase-sequence voltage have been used for detection of fault in the three phase power line.

However, the conventional structure of insulator as shown in FIG. 17 and FIG. 18 has a shortcoming in that the lead wires 93 emanating from the current transformers 92 and the potential transformer 96 are susceptible to electromagnetic induction caused by the external electromagnetic field. Accordingly, the S/N ratio of the output signal is kept low and the accuracy of measurement is comparatively low. In order to improve the reliability of transmission lines and distribution lines, there is an increasing demand for accurate detection of those faults which have not been detected heretofore by conventional means, such as instantaneous groundings and intermittent groundings. Thus, there is a demand for higher accuracy of the measurement of line voltages and line currents.

Further the deterioration by aging of lead wires 93 can be a cause of grounding faults and when the insulating strength of the current transformer 92 and the potential transformer 96 are deteriorated, such transformers themselves can also be a cause of a grounding fault.

DISCLOSURE OF THE INVENTION

An object of the invention is to provide an electric measuring device and an insulator therefor which device and insulator have a high insulating strength, a high S/N ratio and a high accuracy of measurement.

One of specific objects of the invention is to provide a porcelain insulator having at least one optical transmission medium embedded in a porcelain body thereof so as to extend in an axial direction thereof, the optical transmission medium is integrally formed with the porcelain body by being fired therewith.

A further object of the invention is to provide a porcelain insulator having a porcelain insulator body with a through hole extending in an axial direction thereof and at least one optical transmission medium disposed in the through hole. An insulation layer is formed in the gap between the inner surface of the through hole and the optical transmission medium either by filling resilient organic insulating material, e.g., rubber, therein or by welding inorganic insulating material, e.g., glass, therein. The insulation layer integrally bonds the optical transmission medium to the porcelain insulator body.

The above-mentioned porcelain insulator transmits light through the optical transmission medium embedded therein in the axial direction thereof. Accordingly, if an optical sensor is mounted on the insulator and coupled to the optical transmission medium thereof, a porcelain insulator with a built-in optical sensor is produced. Since the optical transmission medium is integrally formed with or integrally bonded to the porcelain insulator body, the inside of the insulator body is protected against infiltration of moisture and dust particles. Thus, although the porcelain insulator of the invention has the optical transmission medium embedded therein, the intrinsic insulating strength and the intrinsic mechanical strength of the porcelain insulator per se are maintained intact.

It is another object of the invention to provide an electric measuring device for a three-phase power line, which device comprises an optical transmission line, such as an optical fiber cable line, coupled to a light-emitting unit at one end thereof and to light-detector at the opposite end thereof. The light transmitting line receives light from the light-emitting unit at a given optical power. Three conductors of the three-phase power line ar supported by three porcelain insulators, which insulators carry electro-optic sensors mounted thereon so as to form a sensor unit. Each electro-optic sensor modulates the incident light at the given optical power in response to electric variation in each phase. The sensor unit is serially connected to an intermediate portion of the above-mentioned optical transmission line.

With the above electric measuring device of the present invention, highly reliable insulating strength and immunity to external electromagnetic induction are ensured by the combination of the optical transmission line and the optical sensors, e.g., electro-optic elements.

In operation, any variation of the current or voltage in each phase of the power three-phase line is applied to the electro-optic sensor of the corresponding phase as a stimulus thereto. The light which emanates from the light-emitting unit at the given optical power is introduced to the electro-optic sensors in succession through the above-mentioned optical transmission line. At each electro-optic sensor the light is phase-modulated as it passes therethrough depending on the electric change in each phase. If the planes of polarization are maintained in the light transmission line under such conditions, the composite phase modulation of the light across the opposite ends of the optical transmission line is proportional to the zero-phase-sequence component of the currents or voltages of the three-phase line. Such composite phase modulation is delivered to the light-detector and converted thereby into an electric signal so as to facilitate detection and measurement of the zero phase-sequence component of the electric changes in the three-phase power line.

Another object of the invention is to provide an electric measuring device for a three-phase power line, which device has three separate sets comprising a light-emitter, optical transmission line, optical sensor, and a light-detector, so as to produce electric output signals for each phase separately. More particularly, each of three insulators supporting the line conductors has an optical sensor mounted thereon, which sensor can modulate incident light thereto at a given optical power. Each optical sensor is coupled to the optical transmission line whose opposite ends are directly coupled to the light-emitting unit and the light-detector, respectively.

In operation of this electric measuring device of the invention, the current or voltage of each phase is optically measured and converted into an electric signal; namely, light is applied to the optical sensor of each phase at a given optical power from the light-emitting unit through the optical transmission line of the phase, and the light is phase-modulated by the optical sensor by a degree depending on the current or voltage of the phase, and the light-detector of the phase converts the thus modulated light into electric signals whose magnitudes are proportional to the current or voltage of the phase. A three-phase signal synthesizing circuit adds and combines the electric signals of the individual phases. Relays connected to the three phase signal synthesizing circuit selectively send out only those signals which are at predetermined levels, so as to indicate the three-phase line information on a signal display.

In short, with the electric measuring device of the invention, light is delivered to the optical sensor of each phase at an optical power through an optical transmission line, and the optical sensor located right by the phase conductor modulates the light depending on the current or voltage of the phase, and the modulated light is transmitted to the light-detector and converted thereby into an electric signal. Accordingly, the device is immune to both external electromagnetic induction and insulation deterioration at the sensor unit and transmission line of the information. Thus, high safety and high accuracy of measurement are maintained in a reliable manner.

BRIEF DESCRIPTION OF THE DRAWING

FIG. 1 is a vertical sectional view of a first embodiment of the porcelain insulator with a built-in optical transmission medium according to the invention;

FIG. 2 is a vertical sectional view of a second embodiment of the porcelain insulator for the invention;

FIG. 3 is a vertical sectional view of a third embodiment of the porcelain insulator of the invention;

FIG. 4 is a vertical sectional view of a fourth embodiment of the porcelain insulator of the invention;

FIG. 5 is a vertical sectional view of an electric measuring device formed of an insulator of FIG. 3 and an electro-optic element mounted thereon;

FIG. 6 is a perspective view showing an arrangement of a fifth embodiment of the invention in which the above electric measuring device is mounted on a three-phase power line pole;

FIG. 7 is an explanatory diagram of the optical system of the fifth embodiment;

FIG. 8 is a vertical sectional view of a sixth embodiment of the invention;

FIG. 9 is a schematic diagram of an optical circuit for a three-phase potential transformer which uses the embodiment of FIG. 8;

FIG. 10 is a vertical sectional view of a seventh embodiment of the invention for measuring current and voltage of a power line conductor;

FIG. 11 is a schematic perspective view in which the devices of FIG. 10 are mounted on a three-phase power line pole;

FIG. 12 is vertical sectional view of an electric measuring device as a part of an eighth embodiment of the invention;

FIG. 13 is a partial sectional view taken along the line A—A of FIG. 12;

FIG. 14 is a sectional view of an optical sensor which is used in the electric measuring device of FIG. 12;

FIG. 15 is a schematic diagram of electric wiring and optical paths of an electric measuring device of the invention for a three-phase line;

FIG. 16 is a vertical sectional view of a porcelain insulator with a built-in optical transmission medium of the prior art;

FIG. 17 and FIG. 18 are schematic circuit diagrams of an electric measuring device using porcelain insulators of the prior art; and FIG. 19 is an explanatory diagram of an electric measuring device of the invention which is incorporated in a station post type insulator.

Throughout the specification different views of the drawing, the following symbols are used.

1: an insulator body,
1a: an end surface,
2: an optical transmission medium,
2a: an end portion of the optical transmission medium,
3: a through hole,
4: an organic insulation layer,
5: an inorganic insulation layer,
6: an electro-optic element,
7: an optical connector,
8A, 8B, 8C: power line conductors,
9: a conductor-holding hardware,
10: cement,
11: a base metal,
12: a pole,
13: a cross arm brace,
14: a support arm,
15A-15C: line conductors,
16A, 16B, 16C: insulator units,
17A, 17B, 17C: current transformers,
18A, 18B, 18C: electro-optic elements formed of Pockels-effect elements,
19A, 19B, 19C: resistors,
20: a measuring terminal,
21: a lead wire,
22-25: polarization-maintaining optical fiber cables,
26: a polarizer,
27: a light-emitter,
28: an analyser,
29: a light-detector,
30: a box, -continued 31: a power source,
32a, 32b: conductive spacers,
C1: a capacitor,
C2: static capacitance,
33: an output terminal,
34: a clamping hardward,
35A, 35B, 35C: sensing units,
36A, 36B, 36C: optical fiber cables,
37: a measuring unit,
38: an amplifier,
39: a power source,
40: a base metal,
41: an optical connector,
42: a metallic flange,
43: a metallic cylinder,
44: a packing,
45: a bolt,
46: a current transformer,
46c: a core
46d: a winding,
47: a bolt,
48: a resistor,
49: a collector electrode unit,
49a: a first electrode,
49b, 49d: lead wires,
49c: a second electrode,
50: an optical sensor,
51: an insulated case,
52: an electo-optic element,
53: a ¼ (one-quarter) wavelength plate,
54: a reflector,
55: a rod lens,
56: a polarizer,
58: insulating filler,
59: a holder for optical transmission medium,
60, 61: electrodes,
62, 63: lead wires,
64: insulating filler,
69: a light-emitter for current measurement,
70A, 70B, 70C: optical transmission lines,
71A, 71B, 71C: light-detectors for current measurement,
72A, 72B, 72C: light-detectors for voltage measurement,
73: a current signal sythesizing circuit,
74: a voltage signal synthesizing circuit,
75: a ground relay,
76: a signal display,
77: a short-circuit relay,
78A, 78B, 78C: light-emitters for current measurement,
79A, 79B, 79C: light-emitters for voltage measurement,
81: an insulator body,
81a: a hole,
82, 83: optical fiber connectors,
84: an optical fiber,
85: an O-ring,
86: filler,
91: a power line conductor,
92: a current transformer,
93: a lead wire,
94: a resistor,
95: an output terminal,
96: a potential transforer

DESCRIPTION OF THE PREFERRED EMBODIMENT

FIG. 1 shows a first embodiment of the porcelain insulator with a built-in optical transmission medium according to the invention. A porcelain insulator body 1 is made by preparing a green body of desired shape and dimension and firing the green body. An optical transmission medium 2, such as an optical fiber or an alumina rod with a high optical transmissivity, is buried and sealed in the central portion of the porcelain insulator body 1 so as to extend in an axial direction thereof. The insulator body 1 can be made by a typical conventional method; i.e., by preparing a green body through kneading and defoaming porcelain material in a vacuum pug mill, extruding the kneaded green body in the form of a rod, cutting the rod for shaping it into a desired form, drying the shaped green body, applying a porcelain glaze on the dried body, and firing the glazed body.

In the embodiment of FIG. 1, when the above kneaded green body is extruded, optical transmissive material suitable for the optical transmission medium 2 is simultaneously extruded in a continuous manner so as to bury the medium 2 in the above green body of the porcelain insulator body 1.

The steps of shaping, drying, glazing and firing of the green body can be similar to those of the conventional method of producing porcelain insulators.

The above extrusion of the optically transmissive material can be effected through a vessel of porcelain glaze, so that the optical transmission medium 2 is glazed and then bonded to the porcelain insulator body 1. In the step of firing, the glaze on the surface of the optical transmission medium 2 is once melted before hardened, and very strong bond is made between the optical transmission medium 2 and the porcelain insulator body 1. Further, if the physical and chemical properties of the glaze, such as its coefficient of thermal expansion, are properly selected or adjusted, the thermal and other stress at the boundary between the optical transmission medium 2 and the porcelain insulator body 1 is minimized or eliminated, so that the seal and the mechanical strength of the boundary are stabilized.

FIG. 2 shows a second embodiment of the porcelain insulator with a built-in optical transmission medium according to the invention. A porcelain insulator body 1 is made by preparing a green body of desired shape and dimension, and firing the green body. An optical transmission medium 2 is integrally bonded to the central portion the porcelain insulator body 1 by firing so as to extend in an axial direction thereof. The insulator body 1 can be made in the same manner as in the case of the first embodiment; namely, by preparing a green body through kneading and defoaming porcelain material in a vacuum pug mill, and extruding the kneaded green body in the form of a rod. In the extruding step, optically transmissive material for the optical transmission medium 2 is also extruded so as to continuously press the optically transmissive material into the green body of the insulator body 1 as the latter is extruded. The optically transmissive material is, for instance, made by kneading powder or small particles of various glass materials, such as quartz, alumina, and the like, in a semi-solid state.

The steps of shaping, drying, glazing and firing of the green body can be similar to those of the conventional method of producing porcelain insulators.

The function of the second embodiment is similar to that of the first embodiment described above, and it is not repeated here.

In the course of the above extrusion of the material for the optical transmission medium 2, its green body can be extruded into a cylindrical shape in such a manner that the material in powder or fluid state is forced into a pre-bored through hole 3 of the insulator body 1.

In this case, the optically transmissive material inserted into the through hole 3 is melted at the firing temperature of the insulator body 1, i.e., 1,250-1,300° C., and then it is hardened to produce the optical transmission medium 2. When the optical transmission medium 2 is integrally bonded to the central portion of the insulator body 1 so as to extend in the axial direction thereof, the mechanical strength of the insulator body 1 is kept intact and its internal insulation is stabilized.

FIG. 3 shows a third embodiment of the porcelain insulator with a built-in optical transmission medium according to the invention. A porcelain insulator body 1 is made by preparing a green body of desired shape and dimension, and firing the green body. A through hole 3 is bored in the central portion of the insulator body 1 so as to extend across its opposite end surfaces 1a, 1a. The inner surface of the through hole 3 is kept in a biscuit fired state, namely porcelain glaze for the outer surface of the insulator body 1 is not applied to the inner surface of the through hole 3. An optical transmission medium 2, such as an optical fiber or rod-like transmissive element of alumina or quartz, is disposed in the through hole 3, while projecting end portions 2a, 2a of the optical transmission medium 2 out of opposite end surface 1a, 1a of the insulator body 1. Resilient organic insulating material, such as EPDM rubber, is molded in the space between the inner surface of the through hole 3 and the optical transmission medium 2, so as to produce an organic insulation layer 4 in the space.

To produce the organic insulation layer 4 in the porcelain insulator of FIG. 3, the insulator body 1 is held between an upper metallic mold and a lower metallic mold while inserting suitable packings between the opposite end surface 1a, 1a of the insulator body 1 and the facing metallic molds. At the same time, the optical transmission medium 2 is held tau in the through hole 3 of the insulator body 1 by fastening the opposite end portions 2a, 2a of the medium 2 to the metallic molds. A pouring hole is provided on one of the metallic molds in communication with the through hole 3, and organic insulating material such as rubber is poured therein, so as to integrally bond the optical transmission medium 2 to the through hole 3 by the thus poured organic insulating material.

When EPDM rubber is used for the molding of the organic insulation layer 4, an evacuating passage is formed on the other one of the metallic molds, and a vacuum pump or other suitable vacuum source is connected to the evacuating passage. Before the start of the EPDM rubber pouring, the pressure in the inside space of the through hole 3 and the gas passages of the metallic molds is reduced by evacuation. With this arrangement, the organic insulation layer 4 ca be molded without any foams therein. In general, the preferable range of the reduced air pressure in the above-mentioned inside space and gas passages is, for instance, about 0.5-0.01 atmospheric pressure.

As to the preheating of the metallic molds and the EPDM rubber material and the vulcanization of the EPDM rubber after the pouring, current practices of rubber molding technology can be used in the invention.

The material for the organic insulation layer 4 is not restricted to the EPDM rubber, but other suitable molded synthetic resin such as polyethylene can be also used. In the above molding process adhesive may be applied to the inner surface of the through hole 3 and the outer surface of the optical transmission medium 2 before the pouring.

FIG. 4 shows a fourth embodiment of the invention. In this embodiment, an inorganic insulation layer 5 made of porcelain glaze, glass or other inorganic insulating material is formed in a space between the inner surface of the through hole 3 of the insulator body 1 and the optical transmission medium 2. This inorganic insulation layer 5 acts to integrally bonds the optical transmission medium 2 to the insulator body 1 upon being fired. Material for the inorganic insulation layer 5 is selected from those porcelain glazes and glass materials which have a melting point lower than that of the firing temperature of porcelain which is 1,250–1,300° C. The porcelain body 1 is once fired into a prescribed shape, and after the loading of the optical transmission medium 2 and the material for the inorganic insulation layer 5, it is re-fired. The maximum re-firing temperature is preferably about 1,100° C. However, if the insulator body 1 is made of high alumina porcelain or other porcelain having a high firing temperature, the above material for the inorganic insulation layer 5 may have a somewhat higher melting point.

Components of optical measurement, such as an electro-optic element 6 and an optical connector 7, are coupled to the end portions 1a, 1a of the optical transmission medium 2 in the insulator body 1 of any of the above embodiments as shown in FIG. 5. In the example of FIG. 5, a conductor-holding hardware 9 for holding a power line conductor 8 is secured to the top end of the insulator body 1 by cement 10, while a base metal 11 on the ground-side is secured to the bottom of the insulator body 1 also by cement 10. Thus, an insulator unit which has an optical sensor function of modern light-application technology can be easily formed in a convenient manner.

Examples of electric measuring devices of the present invention using the above insulator unit will be described in detail by referring FIG. 6 through FIG. 15.

In a fifth embodiment of the invention shown in FIG. 6, three insulator units 16A, 16B, and 16C are mounted in a row on a support arm 14 which is carried by a pole 12 with a cross arm brace 13 so as to hold three-phase line conductors 8A, 8B, and 8C, respectively. Each of the line conductors 8A, 8B, and 8C held by the insulator units 16A, 16B, and 16C passes through the corresponding one of the current transformers 17A, 17B, and 17C at the conductor-holding hardware on the top of the insulator units 16A, 16B, and 16C.

The function of the insulator units 16A, 16B, and 16C will now be described by referring to FIG. 7. The porcelain body 1 is formed into desired shape and dimension and then fired, and the conductor-holding hardware 9 is secured to the top of the insulator body 1 by cement 10. The base metal 11 on the ground-side is secured to the bottom of the insulator body 1 similarly by cement 10. A pair of optical transmission media 2, such as polarization-maintaining optical fiber cables or bar-like optical transmission media made of alumina or quartz, extend through the central portion of the insulator body 1 in a axial direction thereof. The optical transmission media 2, 2 are integrally secured to the insulator body 1.

A hollow space 9a is formed in the conductor-holding hardware 9 of each of the three insulator units 16A, 16B, and 16C. A parallel combination of a Pockels-effect element 18a, acting as an electro-optic element, and a resistor 19A is disposed in the above hollow space 9a and connected to the upper ends of the paired optical transmission media 2, 2 for the insulator unit 16A. Similarly, Pockels-effect elements 18B and 18C are combined with the resistors 19B and 19C, and such combinations are disposed in the hollow space 9a and connected to the upper ends of the paired optical transmission media 2, 2 in the insulator units 16B and 16C, respectively. Each of the above-mentioned parallel combinations of the Pockels-effect elements 18A, 18B, and 18C with the corresponding resistors 19A, 19B, and 19C is connected across the measuring terminals 20, 20 of the corresponding one of the current transformers 17A, 17B, and 17C through lead wires 21, 21. Thus, secondary currents of the current transformers 17A, 17B, and 17C representing currents on the line conductors 8A, 8B, and 8C flow through the corresponding resistors 19A, 19B, and 19C from the measuring terminals 20, 20, respectively. The voltages across the resistors 19A, 19B, and 19C are applied to the corresponding Pockels-effect elements 18A, 18B, and 18C, respectively. The lower ends of the paired optical transmission media 2, 2 of the insulator units 16A, 16B, and 16C are connected to the corresponding optical connectors 7A, 7B, and 7C, respectively.

The current transformers 17A, 17B, and 17C prevents current measurement in each phase from being interfered by quantities in phases.

The paired optical transmission media 2, 2 of the insulator units 16A, 16B, and 16C are connected in series by means of optical paths formed of polarization-maintaining optical fiber cables 22, 23, 24, and 25 which are connected to the above-mentioned optical connectors 7a, 7B, and 7C. Thus, a continuous serial optical transmission line is formed by the Pockels-effect elements 18A, 18B, 18C and the paired optical transmission media 2, 2 of the insulator units 16A, 16B, 16C and the polarization-maintaining optical fiber cables 22 through 25.

An input end of the above serial optical transmission line, i.e., free end of the polarization-maintaining optical fiber cable 22, is coupled to a polarizer 26 formed of a polarizer plate and a ¼ wavelength plate, so that a light-emitting unit 27, e.g., a light-emitting diode, is coupled to the optical fiber cable 22 through the polarizer 26. The polarizer 26 and the light-emitting unit 27 form a light source. Thus, the light which emanates from the above light source enters into the polarization-maintaining optical fiber cable 22 at a certain optical power. If a laser diode which emanates linearly polarized light is used in the light source, the polarizer 26 can be dispensed with.

The output end of the above serial optical transmission line, i.e., the free end of the polarization-maintaining optical fiber cable 25 is connected to an analyser 28, and the analyser 28 is optically coupled to a light-detector 29. The analyser 28 and the light-detector 29 form a light-detecting unit. The light which has travelled through the above serial optical transmission line is applied to the light-detector 29 from the polarization-maintaining fiber cable 25 through the analyser 28.

The light source and the light-detecting unit of this embodiment are housed in a box 30. The box 30 is mounted at a suitable portion of the pole 12.

The function of the fifth embodiment of the invention will now be described by referring to FIG. 7.

Primary currents in the line conductors 8A, 8B, and 8C induce secondary currents in the current transformers 17A, 17B, and 17C, respectively. The secondary currents are applied to the resistors 19A, 19B, and 19C through the lead wires 21, 21, respectively. The voltages across the resistors 19A, 19B, and 19C are applied to the Pockels-effect elements 18A, 18B, and 18C, respectively.

If the power source is energized, the light-emitting unit 27 emanates light at a certain optical power. This light proceeds to the Pockels-effect element 18A through the polarization-maintaining optical fiber cable 22 and the optical transmission medium 2 as shown by the arrows of FIG. 7 without being affected by electromagnetic induction from outside. The incident light to the Pockels-effect element 18A is phase-modulated by a degree depending on the magnitude of the voltage applied to the element 18A (which voltage is proportional to the current of the line conductor 8A).

The light from the Pockels-effect element 18A proceeds to the next Pockels-effect element 18B through the optical transmission medium 2, the polarization-maintaining optical fiber cable 23 and the optical transmission medium 2 as shown by the arrows of FIG. 7 without being affected by electromagnetic induction from outside. The incident light to the Pockels-effect element 18B is similarly phase-modulated by a degree depending on the voltage applied thereto (representing the current of the line conductor 8B).

The light from the Pockels-effect element 18B proceeds to the next Pockels-effect element 18C through the optical transmission medium 2, the polarization-maintaining optical fiber cable 24 and the optical transmission medium 2 as shown by the arrows of FIG. 7 without being affected by electromagnetic induction from outside. The incident light to the Pockels-effect element 18C is similarly phase-modulated by a degree depending on the voltage applied thereto (representing the current of the line conductor 8C). The phase-modulated light from the last Pockels-effect element 18C proceeds to the analyser 28 through the optical transmission medium 2 and the polarization-maintaining optical fiber cable 25 as shown by the arrows of FIG. 7 without being affected by electromagnetic induction from outside. The incident light to the analyser 28 is intensity-modulated thereat. The light delivered to the analyser 28 is phase-modulated by a degree which corresponds to the vector sum of the currents of the three-phase line conductors 8A, 8B and 8C. Thus, the degree of phase-modulation is proportional to the zero-sequence component current. The phase-modulated light is then applied to the light detector 29 which converts it into an electric signal.

If the electric signal from the light-detector is amplified by a suitable amplifier and delivered to output terminals, then the zero-sequence component current can be easily detected and measured simply by connecting the signal from the output terminals to a suitable meter.

The value of the zero-sequence component current is zero under normal balanced conditions, but it assumes a finite value upon occurrence of an unbalanced line fault. Accordingly, presence of unbalanced fault on the line can be monitored by detecting and measuring the zero-sequence component current in the above-mentioned manner.

FIG. 8 shows a sixth embodiment of the invention. Like parts as those of the fifth embodiment are designated by like numerals without any detailed structural descriptions thereof. The mechanical structure of the sixth embodiment will be described by referring to only the insulator unit 16A for the phase A of a three-phase power line, but the insulator units 16B and 16C for the phases B and C have the identical structure as that of the insulator unit 16A.

A capacitor C1 is disposed in the hollow portion 9a of the conductor-holding hardware 9 of the insulator unit 16A, and one end of the capacitor C1 is electrically connected to the conductor 8A through a conductive spacer 32a while its opposite end is connected to the top surface of the insulator body 1 through another conductive space 32b. The line conductor 8A is fastened to the top of the conductor-holding hardware 9 by a clamping hardware 34. The electro-optic element 18A, i.e., the Pockels-effect element, is connected in parallel to the capacitor C1 through the conductive spacers 32a and 32b.

FIG. 9 shows an equivalent circuit of a measuring system which uses the insulator units 16A, 16B, and 16C of the sixth embodiment. Electrostatic capacitances C2 represent the electrostatic capacitance of the insulator units 16A, 16B, and 16C.

The function of the measuring system of FIG. 9 will be explained now.

The voltage of each line conductor 8A, 8B, or 8C held by the clamp hardware 34 is applied to the capacitor C1 through the conductive spacer 32a. The voltage across the capacitor C1 is applied to the corresponding Pockels-effect element 18A, 18B, or 18C.

When a power source 31 for actuating the light-emitting unit 27 is turned on, the unit 27 emits light at a certain optical power. The light is linearly polarized by the polarizer 26, and the polarized light from the polarizer 26 proceeds to the Pockels-effect element 18A through the polarization-maintaining optical fiber cable 22 and the optical transmission medium 2 as shown by the arrows of FIG. 9 without being affected by electromagnetic induction from outside. The incident light to the Pockels-effect element 18A is phase-modulated by a degree depending on the magnitude of the voltage applied to the element 18A (which voltage is proportional to the voltage of the line conductor 8A).

The light from the Pockels-effect element 18A proceeds to the next Pockels-effect element 18B through the optical transmission medium 2B, the polarization-maintaining optical fiber cable 23 and the optical transmission medium 2C as shown by the arrows of FIG. 9 without being affected by electromagnetic induction from outside. The incident light to the Pockels-effect element 18B is similarly phase-modulated by a degree depending on the voltage applied thereto (representing the voltage of the line conductor 8B).

The light from the Pockels-effect element 18B proceeds to the next Pockels-effect element 18C through the optical transmission medium 2D, the polarization-maintaining optical fiber cable 24 and the optical transmission medium 2E as shown by the arrows of FIG. 9 without being affected by electromagnetic induction from outside. The incident light to the Pockels-effect element 18C is similarly phase-modulated by a degree depending on the voltage applied thereto (representing the voltage of the line conductor 8C). The phase-modulated light from the last Pockels effect element 18C proceeds to the analyser 28 through the optical transmission medium 2F and the polarization-maintaining optical fiber cable 25 as shown by the arrows of FIG. 9 without being affected by electromagnetic induction from outside. The incident light to the analyser 28 is intensity-modulated thereat. The light delivered to the analyser 28 is phase-modulated by a degree which corresponds to the vector sum of the voltages of the three-phase line conductors 8A, 8B and 8C. Thus, the degree of phase-modulation is proportional to the zero-sequence component voltage. The phase-modulated light is then applied to the light-detector 29 which converts it into an electric signal.

If the electric signal from the light-detector 29 is amplified by a suitable amplifier 38 and delivered to output terminals 33A, 33B, then the zero-sequence component voltage can be easily detected and measured simply by connecting the signal from the output terminals 33A, 33B to a suitable meter.

The zero-phase-sequence component voltage assumes a value of zero under normal balanced conditions, but it assumes a finite value upon occurrence of an unbalanced line fault. Accordingly, absence or presence of an unbalanced fault on the line can be monitored by detecting and measuring the zero-sequence component voltage in the above-mentioned manner.

FIG. 10 shows a seventh embodiment of the invention. As in the case of the sixth embodiment, like parts as those of the preceding embodiments are designated by like numerals without any detailed structural descriptions thereof. The mechanical structure of the seventh embodiment will be described by referring to only the insulator unit 16A for the phase A of a three-phase power line, but the insulator units 16B and 16C for the phases B and C have the identical structure as that of the insulator unit 16A.

The seventh embodiment fulfils the zero-sequence current detection of the fifth embodiment and the zero-sequence voltage detection of the sixth embodiment by a single set of three insulator units 16A, 16B, and 16C. Two Pockels-effect elements 18A, one for measuring the zero-sequence current and one for measuring the zero-sequence voltage, are disposed in the hollow portion 9a of the conductor-holding hardware 9 of the insulator unit 16A as shown in FIG. 10. Two pairs of optical transmission media 2, 2 are integrally buried in the central portion of the insulator body 1 so as to extend in an axial direction thereof. Each pair of the optical transmission media 2, 2 are coupled to the corresponding one of the Pockels-effect element 18A.

In operation, the insulator units of the seventh embodiment can simultaneously fulfil detection and measurement of both the zero-sequence current and the zero-sequence voltage in the same manner as described above by referring to the fifth embodiment and the sixth embodiment. Accordingly, the details of the function will not be repeated here.

Since the seventh embodiment facilitates the detection and measurement of both the zero-sequence current and the zero-sequence voltage by one set of the insulator units, it provides a certain saving in the space for installation of the measuring devices therefor.

Another, i.e., eighth, embodiment of the electric measuring device according to the invention, which uses a different connection of optical paths and different measuring principles, will be described now by referring to FIG. 11 through FIG. 15.

Referring to FIG. 11, the electric measuring device comprises insulator units 16A, 16B, and 16C mounted on the support arm 14 of the pole 12 so as to hold the three-phase line conductors 8A, 8B, and 8C; sensing units 35A, 35B, and 35C mounted on the conductor-holding portions of the insulator units 16A, 16B, and 16C; optical transmission lines formed of optical fiber cable 36A, 36B, and 36C connected to the bottom of the insulator units 16A, 16B, and 16C phase by phase; and a measuring unit 37 mounted on the pole 12 and connected to the optical fiber cables 36A, 36B, and 36C. The measuring unit 37 has a power source 39 for the measurement and a light-emitter and a light-detector as will be described hereinafter.

It is also possible to suspend the insulator units 16A, 16B, and 16C from the three-phase line conductors 8A, 8B, and 8C respectively, which insulator units carry the sensing units 35A, 35B, and 35C at their conductor-holding portions. The optical fiber cables 36A, 36B, and 36C may extend from the bottom of the suspending insulator units to the measuring unit 37. In this arrangement, the line conductors 8A, 8B, and 8C are supported by separate regular insulators for conductor support.

As to the detailed structures of the insulator units 16A, 16B, 16C, the line conductors 8A, 8B, 8C, and the sensing units 35A, 35B, 35C, description will be made only for those of phase A of the three-phase line, i.e., 16A, 8A, and 35A by referring to FIGS. 12 through 14. It is understood that those for other phases are identically constructed. As shown in FIG. 12, two pairs of parallel optical transmission media 2, 2 are buried in the porcelain body 1 of the insulator unit 16A so as to extend in the axial direction thereof. The optical transmission media 2, 2 are made of optically transmissive ceramics such as optical fiber, quartz or the like, and they are disposed in the through hole 3 bored in the insulator body 1 and integrally bonded to the insulator body 1 either by an adhesive method using adhesive material such as rubber or suitable resin or by a welding method involving the heat-melting of inorganic insulating material such as low-melting-point glass or the like. A base metal 40 is secured to the bottom of the insulator body 1. Two pairs of optical connectors 41 are mounted on the base metal 40, and the lower ends of each pair of the optical transmission media 2, 2 are connected to the corresponding pair of the optical connectors 41.

The sensing unit 35A will be described now. As shown in FIGS. 12 through 14, a metallic flange 42 is secured to the top of the insulator body 1 so as to surround the top surface of the latter, and a metallic cylinder 43 is coupled to the metallic flange 42 by bolts 45 while inserting a packing 44 between the bottom of the metallic cylinder 43 and the top of the insulator body 1. A current transformer 46 having an upper half 46a and a lower half 46b is fitted in the top opening of the metallic cylinder 43. The upper half 46a of the current transformer 46 is fastened to the top end of the metallic cylinder 43 by bolts 47, while its lower half 46b rests on a step 43a formed on the inner surface of the metallic cylinder 43. The current transformer 46 has a pair of mating semicircular cores 46c, 46c and a winding 46d wound around the core 46c. The winding 46d is connected to a first optical sensor 50, and the first optical sensor 50 is joined and fixed to the upper end surfaces of one pair of the optical transmission media 2, 2.

A resistor 48 is connected to the winding 46d in parallel to the first optical sensor 50.

The line conductor 8A is held between the upper half 46a and the lower half 46b of the current transformer 46. A collector electrode unit 49 is disposed in the metallic cylinder 43 so as to face and to be spaced from the line conductor 8A with a certain amount of insulation. The collector electrode unit 49 has a first electrode 49a facing the line conductor 8A and a second electrode 49c separated from the first electrode 49a by a certain insulating space. The first electrode 49a and the second electrode 49c are connected to a second optical sensor 50 through lead wires 49b and 39d respectively. The second optical sensor 50 is joined and fixed to the upper end surfaces of the remaining pair of the optical transmission media 2, 2.

As shown in FIG. 14, the optical sensor 50 has an insulated case 51 carrying an electro-optic element 52, such as a Pockels-effect element, disposed therein. A combination of a ¼ wavelength plate 53 and a reflector 54 is disposed on and integrally secured to the top of the electro-optic element 52. A combination of a rod lens 55 and a polarizer plate 56 is disposed on and integrally secured to the bottom surface of the electro-optic element 52. An optical transmission medium 2 such as an optical fiber is joined to the polarizer plate 56, and the lower portion of the optical transmission medium 2 is drawn to the outside of the insulated case 51. Suitable insulating filler 58 is stuffed in the inside of the insulated case 51. The optical transmission medium 2 is held in position by holders 59, 59 therefor.

Electrodes 60, 61 are attached to opposing surfaces of the electro-optic element 52 of the optical sensor 50, and the electrodes 60, 61 are connected either across the winding 46d of the current transformer by lead wires 62, 63 or across the first electrode 49a and the second electrode 49c of the collector electrode unit 49 by the lead wires 49b and 49d thereof. The insulated case 51 and the insulating filler 58 of the optical sensor 50 can be dispensed with, and in this case the optical transmission medium 2 of the insulator body 1 can be directly coupled to the polarizer plate 56. Preferably, insulating filler 64, such as rubber or resin, is stuffed in the metallic cylinder 43 of the sensing unit 35A, so as to enhance the insulating strength and prevent the moisture infiltration therein.

The measuring unit 37 of the electric measuring device will be described now by referring to FIG. 15.

Separate optical transmission lines 70A, 70B, and 70C are formed for the three phases of the power line by the optical fiber cables 36A, 36B, and 36C connected to the sensing units 35A, 35B, and 35C for the line conductors 8A, 8B, and 8C. Each of the optical-transmission lines 70A, 70B, and 70C is divided into two portions; i.e., paths from the current transformers 46 to optical-detectors for current measurement 71A, 71B, and 71C, and paths from the collector electrode units 49 to optical-detectors for voltage measurement 72A, 72B, and 72C. In the illustrated embodiment, the optical-detectors for current measurement 71A, 71B, and 71C for the individual phases are connected to a current signal synthesizing circuit 73, while the optical-detectors for voltage measurement 72A, 72B, and 72C for the individual phases are connected to a voltage signal synthesizing circuit 74. The current signal synthesizing circuit 73 and the voltage signal synthesizing circuit 74 are connected to a signal display 76 through a ground relay 75. In this embodiment, the circuits between the optical-detectors for current measurement 71A, 71B, and 71C and the current signal synthesizing circuit 73 are branched and connected to a short-circuit relay 77, and the output of the short-circuit relay 77 is also applied to the signal display 76. The optical-detectors for current measurement 71A, 71B, and 71C for the individual phases are optically coupled to light-emitters for current measurement 78A, 78B, and 78C through the current-measuring portion of the optical transmission lines 70A, 70B, and 70C. The optical-detectors for voltage measurement 72A, 72B, and 72C for the individual phases are optically connected to light-detectors for voltage measurement 79A, 79B, and 79C through the voltage-measuring portion of the optical transmission lines 70A, 70B, and 70C.

The above current signal synthesizing circuit 73 and the voltage signal synthesizing circuit 74 act to derive vector sums of electric signals form the optical-detectors for current measurement 71A, 71B, and 71C and the optical-detectors for voltage measurement 72A, 72B, and 72C, which electric signals represents the degree of phase-modulation caused at the sensing units 35A, 35B, and 35C on the lights emanated from the light-emitters for current measurement 78a, 78B, and 78C and the light-emitters for voltage measurement 79A, 79B, and 79C. The ground relay 75 receives electric signals from the current signal synthesizing circuit 73 and the voltage signal synthesizing circuit 74, and it produces its output signal when the signals from the circuits 73 and 74 are in excess of a certain level and such signals from the circuits 73 and 74 have a phase which is within a certain range relative to the transfer of the power line sinusoidal A.C. voltage.

The short-circuit relay 77 produces its output signal when any of the electric signals for various phases exceeds a certain level.

It should be understood here that the current signal synthesizing circuit 73 and the voltage signal synthesizing circuit 74 are not essential in the invention and that currents and voltages of the individual phases can be measured by directly connecting suitable current or voltage measuring instruments to the optical-detectors for current measurement 71A, 71B, and 71C and the optical-detectors for voltage measurement 72A, 72B, and 72C. Besides, the use of the electric measuring device of the invention is not limited to the three-phase line but it can be applied to any kind of electric circuits.

The current signal synthesizing circuit 73, the voltage signal synthesizing circuit 74, the ground relay 75, and short-circuit relay 77 to be used in the circuit of FIG. 15 can be of conventional type. Various displays and annunciators ca be selectively incorporated in the signal display 76.

The function of the eighth embodiment explained above by referring to FIG. 11 through FIG. 15 will be explained now.

The currents of the line conductors 8A, 8B, and 8C produce magnetic field in the cores 46c of the current transformer 46 at the sensing portions 35A, 35B, and 35C of the insulator units 16A, 16B, and 16C for holding the line conductors, and secondary currents are induced in the secondary windings 46d in proportion to the current of the corresponding line conductors. The secondary currents are converted into corresponding voltage by the resistors 48 connected thereto. The voltages across the resistors 48 are applied to electro-optic element 52 of the first optical sensors 50 by the electrodes 60, 61.

Each of the collector electrode units 49 in sensing units 35A, 35B, and 35C produces a voltage difference across the first electrode 49a and the second electrode 49c which is proportional to the voltage of the corresponding line conductor 8A, 8B, or 8C. This voltage difference is a differential between a secondary voltage induced on the first electrode 49a spaced from the line conductor 8A, 8B, or 8C, and another secondary voltage induced on the second electrode 49c facing the first electrode 49a with a spacing therefrom. The voltage difference between the first electrode 49a and the second electrode 49c is applied to the electrodes 60 and 61 of the electro-optic element 52 of the second optical sensor 50 through the lead wires 49b and 49d.

Light emanating at a certain optical power from the light emitter for power source measurement 78A, 78B, or 78C of the measuring unit 37 is response to the energization of the power source 39 is applied to the first optical sensor 50 through the optical fiber cable 36A, 36B, or 36C, the optical connector 41 at the bottom of the insulator unit 16A, 16B, or 16C, and the corresponding optical transmission medium 2 in the insulator bodies 1.

Light emanating at a certain optical power from the light-emitter for current measurement 79A, 79B, or 79C of the measuring unit 37 in response to the energization of the power source 39 is similarly applied to the second optical sensor 50.

The incident light to the first or second optical sensor 50 is phase-modulated by the Pockels effect of the electro-optic element 52 in the optical sensor 50 by a degree proportional to the sensor voltage applied across the electrodes 60, 61, which sensor voltage is proportional to the current or the voltage of the corresponding line conductor 8A, 8B, or 8C. The phase-modulated light is intensity-modulated into an optical signal with intensity variation by means of the polarizer 56 and the ¼ wavelength plate 53. After being reflected by the reflector 54, the modulate light proceeds to either the light-detector for current measurement 71A, 71B, or 71C, or the light-detector for voltage measurement 72A, 72B, or 72C by way of the optical transmission medium 2 in the insulator body 1, the optical connector 41, and the optical fiber cable 36A, 36B, or 36C. The light-detector for current measurement 71A, 71B, and 71C and the light-detector for voltage measurement 72A, 72B, and 72C convert the optical signals received into electric signals respectively. The converted electric signals are delivered to the current signal synthesizing circuit 73 and the voltage signal synthesizing circuit 74 for processing them on the basis of the method of symmetrical coordinates. The outputs from the circuits 73 and 74 are applied to the ground relay 75, and the relay 75 produces its output signal when the signals from the circuits 73 and 74 are in excess of a certain level and such signals from the circuits 73 and 74 have a phase which is within a certain range relative to the phase of the power line sinusoidal A.C. voltage. The output from the ground relay 75 is applied to the signal display 76. The above signal processing is to detect and measure the zero-sequence current and the zero-sequence voltage in the three-phase power line, so as to detect any ground fault and to facilitate ensuing actions such as display on the signal display 76. Under balanced normal conditions, the vector sum of the three phase currents or the three phase voltage is zero and the ground relay 75 does not operate.

In the example of FIG. 15, the current signals for the three phase are branched at intermediate portions between the light detectors for current measurement 71A, 71B, and 71C and the current signal synthesizing circuit 73, and the branched signals are applied to the short-circuit relay 77. The output from the short-circuit relay 7 is also applied to the signal display 76. The short-circuit relay 77 produces a short-circuit fault signal when any of the electric signals for the three phases exceeds a certain level, namely when any phase current surpasses a predetermined limit. The short-circuit fault signal is applied to and displayed on the signal display 76, so that the electric measuring device monitors each phase of the three-phase power line.

In the electric measuring device of the invention, a first optical sensor 50 for current measurement and a second optical sensor 50 for voltage measurement are disposed in the sensing units 35A, 35B, and 35C, and a resistor 48 is connected in parallel to the first optical sensor 50 while a collector electrode unit 49 having a first electrode 49a and a second electrode 49c is connected in parallel to the second optical sensor 50. Thus, the voltage applicable to the first optical sensor 50 can be adjusted by controlling the resistance of the resistor 48. The voltage applicable to the second optical sensor 50 can be adjusted by controlling the relative insulating space between the first electrode 49a and the second electrode 49c. Consequently, one type of the optical sensor 50 can be used regardless of the magnitudes of the primary voltage and currents, because the secondary voltage applicable to the optical sensor 50 can be easily adjusted in the above-mentioned manner.

Although the sensing unit 35A, 35B, or 35C of the insulator unit 16A, 16B, or 16C of the eighth embodiment of FIG. 12 carries both the first optical sensor 50 for current measurement connected to the current transformer 46 and a second optical sensor 50 for voltage measurement connected to the collector electrode unit 49, it is also possible to mount the current sensor and the voltage sensor on separate insulator units and distribute such insulator units along the power line in a suitable manner.

The use of the electric measuring device is not restricted to distribution lines of a specific voltage class. In fact, it can be used in a broad range of installations, for instance it can be connected to power line conductors in various electric stations or to conductors of transmission lines of extra high or super high voltage class.

FIG. 19 shows an electric measuring device 101 which is installed in a substation of the extra high voltage class. A sensing unit 101a of the measuring device 101 supports the power line conductor 102 in the substation. An optical fiber cable 103 can be connected to the sensing unit 101a through the inside of the electric measuring device 101.

What is claimed is:

1. An insulator for electric measurement, comprising a porcelain insulator body with a built-in optical transmission medium extending therethrough in an axial direction thereof, a conductor-holding fixture secured to one end of the insulator body, a current transformer mounted on the conductor-holding fixture so as to couple with a conductor carried by the conductor holding fixture, a load resistor connected to output current of the current transformer, an electro-optic sensor mounted on the conductor-holding fixture and coupled to voltage across the load resistor, and metal base secured to the opposite end of the insulator body and carrying an optical fiber cable connector, said optical transmission medium having one end thereof coupled to said electro-optic sensor and the opposite end thereof coupled to said optical fiber cable connector.

2. The insulator of claim 1, further comprising a capacitor connected across said one end of the insulator body and a portion of the conductor-holding fixture, and another electro-optic sensor mounted on the conductor-holding fixture and coupled to the capacitor, wherein said optical transmission medium consists of media coupled at one end to said electro-optic sensor and said another electro-optic sensor and at another end to said optical fiber cable connector.

* * * * *

UNITED STATES PATENT AND TRADEMARK OFFICE
CERTIFICATE OF CORRECTION

PATENT NO. : 5,012,182
DATED : April 30, 1991
INVENTOR(S) : Toshisada FUJIKI et al.

It is certified that error appears in the above-identified patent and that said Letters Patent is hereby corrected as shown below:

Please amend the assignee at "[73]" of the title page to read as follows:

--Assignee: NGK Insulators, Ltd., Nagoya, Japan
 CHUBU ELECTRIC POWER COMPANY, INC., Nagoya, Japan--

Signed and Sealed this

Fifth Day of January, 1993

Attest:

DOUGLAS B. COMER

*Attesting Officer*   Acting Commissioner of Patents and Trademarks